US007010437B2

(12) United States Patent
Lubkeman et al.

(10) Patent No.: US 7,010,437 B2
(45) Date of Patent: Mar. 7, 2006

(54) ELECTRIC UTILITY STORM OUTAGE MANAGEMENT

(75) Inventors: David Lubkeman, Cary, NC (US); Danny E. Julian, Willow Spring, NC (US); Martin Bass, Cary, NC (US); J. Rafael Ochoa, Morrisville, NC (US)

(73) Assignee: ABB Research Ltd., Zurich (CH)

( * ) Notice: Subject to any disclaimer, the term of this patent is extended or adjusted under 35 U.S.C. 154(b) by 1 day.

(21) Appl. No.: 10/700,080

(22) Filed: Nov. 3, 2003

(65) Prior Publication Data

US 2005/0096856 A1 May 5, 2005

(51) Int. Cl.
*G01R 31/00* (2006.01)

(52) U.S. Cl. ..................... 702/58; 702/2; 702/3; 702/4; 700/286; 700/292; 340/600; 340/601; 324/72

(58) Field of Classification Search ................ 702/2–4, 702/58; 706/21, 930, 931; 340/7, 48, 500, 340/531, 539.28, 286.02
See application file for complete search history.

(56) References Cited

U.S. PATENT DOCUMENTS 5,214,595 A * 5/1993 Ozawa et al. ................. 702/58
5,568,399 A * 10/1996 Sumic ........................ 700/293
5,771,020 A * 6/1998 Markson et al. ............ 342/460
6,259,972 B1 7/2001 Sumic et al. ............... 700/286
6,405,134 B1 * 6/2002 Smith et al. .................... 702/4
6,583,521 B1 * 6/2003 Lagod et al. .................. 307/70
6,696,766 B1 * 2/2004 Mamo ........................ 290/1 R
2002/0035497 A1 * 3/2002 Mazereeuw et al. ........... 705/7
2002/0107638 A1 * 8/2002 Intriligator et al. ............ 702/3
2003/0004780 A1 1/2003 Smith et al. .................. 705/10
2003/0120426 A1 * 6/2003 Baron et al. .................... 702/3
2004/0095237 A1 * 5/2004 Chen et al. ................. 340/506
2004/0158772 A1 * 8/2004 Pan et al. ...................... 714/14
2004/0167676 A1 * 8/2004 Mizumaki .................. 700/286

OTHER PUBLICATIONS

Abrams, J.R., "A Scalable System for Automating Outage Management for Electrical Utilities", *IEEE*, 2001, 1107-1109.
Blew, D.S., "Outage Management Systems: Surviving the Implementation", *IEEE/PES Summer Power Meeting*, 2001, 1178-1179.
Carter, S. et al., "Outrage Management System Implementation and Operations Experience at Gulf Power Company", *IEEE*, 1998, 854-856.
Hall, D.F., "Outage Management Systems as Integrated Elements of the Distribution Enterprise", *IEEE*, 2001, 1175-1177.
Moore, M.S., Ph.D., et al. "Integrating Information Systems in Electric Utilities", *IEEE*, 2000, 399-404.
Nielsen, T.D. et al., "Improving Outage Restoration Efforts Using Rule-Based Prediction and Advanced Analysis", *IEEE/PES Winter Power Meeting*, 2002, 866-869.

(Continued)

*Primary Examiner*—Carol S. W. Tsai
(74) *Attorney, Agent, or Firm*—Paul R. Katterle; Woodcock Washburn LLP

(57) ABSTRACT

Electric utility storm outage management is performed by determining an interconnection model of an electric utility power circuit, the power circuit comprising power circuit components, determining information indicative of weather susceptibility of the power circuit components, determining a weather prediction, and determining a predicted maintenance parameter based on the interconnection model, the weather susceptibility information, and the weather prediction.

26 Claims, 10 Drawing Sheets

OTHER PUBLICATIONS

Moore, M. et al., "Diagnostics and Integration in Electric Utilities", *IEEE, Rural electric Power Conference. Papers Presented at the 44th Annual Conference*, 2000, 1-10.

Siddiai, U. et al., "Am Expert System Dispatcher's Aid for Distribution Feeder Fault Diagnosis", *Proceedings of the 20th Southeastern Symposium on System Theory*, 1988, 519-523.

"Thriving in an Age of Competition", *Book Analytic-AM. FM International Conference on Thriving in an Age of Competition*, Mar. 1996, 101-108, UGC Consulting, Englewood Co., (U.S.), Kentucky Utilities, Lexington, KY (U.S.).

* cited by examiner

890

ELECTRIC UTILITY STORM OUTAGE MANAGEMENT

FIELD OF THE INVENTION

The invention relates generally to electric utility storm outage management, and more particularly to efficient storm outage management of electric utility maintenance resources and other resources based on predictive and other modeling.

BACKGROUND OF THE INVENTION

Energy companies provide power to consumers via power generation units. A power generation unit may be a coal-fired power plant, a hydro-electric power plant, a gas turbine and a generator, a diesel engine and a generator, a nuclear power plant, and the like. The power is transmitted to consumers via a transmission and distribution system that may include power lines, power transformers, protective switches, sectionalizing switches, other switches, breakers, reclosers, and the like. The transmission and distribution system forms at least one, and possibly more, electrical paths between the generation units and power consumers (e.g., homes, businesses, offices, street lights, and the like).

Severe weather conditions such as hurricanes, ice storms, lightning storms, and the like can cause disruptions of power flow to consumers (i.e., power outages). For example, high winds or ice can knock trees into overhead power lines, lightning can damage transformers, switches, power lines, and so forth. While some power outages may be of short-term duration (e.g., a few seconds), many power outages require physical repair or maintenance to the transmission and distribution system before the power can be restored. For example, if a tree knocks down a home's power line, a maintenance crew may have to repair the downed power line before power can be restored to the home. In the meantime, consumers are left without power, which is at least inconvenient but could be serious in extreme weather conditions (e.g., freezing cold weather conditions). In many circumstances, therefore, it is very important to restore power quickly.

Large storms often cause multiple power outages in various portions of the transmission and distribution system. In response, electric utilities typically send maintenance crews into the field to perform the repairs. If the storm is large enough, maintenance crews are often borrowed from neighboring electric utilities and from external contracting agencies. Dispatching the crews in an efficient manner, therefore, is important to the quick and efficient restoration of power.

Conventional techniques for maintenance crew dispatch include dispatching the crews straight from a central operation center. Once the storm hits, the electric utility then determines where to send the crews based on telephone calls from consumers. Conventional outage management systems log customer calls and dispatch crews to the site of the disturbance based on the customer calls. The engines of conventional outage management systems typically assume that calls from customers that are near each other are associated with a single disturbance or power outage. These conventional outage management systems do not function well under severe weather scenarios for various reasons.

Additionally, conventional outage management systems provide an estimated time to restore a particular section of a power circuit based on historical crew response times only. For example, a suburban customer may be given an estimated time to restore of 2 hours while a rural customer may be given an estimated time to restore of 4 hours. These times are typically based on the historical times for crew to be dispatched and repair an outage. These conventional systems fail to provide accurate estimates for large storms. That is, conventional systems assume that a crew will be dispatched to the outage in a short period of time. With large storms, however, there may be a significant time delay before a crew is sent to a particular outage location (as there are typically multiple outages occurring at the same time).

Thus, there is a need for systems, methods, and the like, to facilitate efficiently dispatching maintenance crews in severe weather situations and for providing an estimated time to restore power to a particular customer that works well for large storms.

SUMMARY OF THE INVENTION

A method for electric utility storm outage management includes determining an interconnection model of an electric utility power circuit, the power circuit comprising power circuit components, determining information indicative of weather susceptibility of the power circuit components, determining a weather prediction, and determining a predicted maintenance parameter based on the interconnection model, the weather susceptibility information, and the weather prediction.

The method may also include determining an observation of the power circuit and determining the predicted maintenance parameter based on the interconnection model, the weather susceptibility information, the weather prediction, and the power circuit observation. The observation may be a power consumer observation report, a data acquisition system report, a maintenance crew report, and the like. The weather susceptibility information may include power line component age, power line pole age, power line component ice susceptibility, power line component wind susceptibility, and the like. The weather prediction may include a predicted wind speed, a predicted storm duration, a predicted snowfall amount, a predicted icing amount, a predicted rainfall amount, and the like.

A computing system may be maintained that predicts the maintenance parameter based on the interconnection model, the weather susceptibility information, and the weather prediction and may be updated based on historical information.

A system for electric utility storm outage management includes a computing engine that is capable of performing determining an interconnection model of an electric utility power circuit, the power circuit comprising power circuit components, determining information indicative of weather susceptibility of the power circuit components, determining a weather prediction, and determining a predicted maintenance parameter based on the interconnection model, the weather susceptibility information, and the weather prediction.

The system may include a damage prediction engine that is capable of performing determining a weather prediction, and determining a per-unit damage prediction, and a storm outage engine that is capable of performing determining an interconnection model of an electric utility power circuit, the power circuit comprising power circuit components, determining information indicative of weather susceptibility of the power circuit components, and determining a total damage prediction based on the interconnection model, the weather susceptibility information, and the per-unit damage prediction.

The system may include a maintenance crew prediction engine that is capable of performing determining a predicted maintenance crew requirement for each type of damage predicted and the storm outage engine may be further capable of performing determining a predicted total time to repair the damage based on the total damage prediction and the predicted maintenance crew requirement for each type of damage.

The predicted maintenance parameter may include a predicted maintenance crew requirement, a predicted maintenance crew person-day requirement based on a predicted damage type, a prediction of a location of power consumers affected by the predicted power circuit damage, a prediction of a time to repair the predicted power circuit damage, a prediction of a cost to repair the power circuit damage, a predicted amount of damage to the power circuit, and the like. The predicted amount of damage may include a predicted number of broken power poles, a predicted number of downed power lines, a predicted number of damaged power transformers, and the like.

A method for electric utility storm outage management includes determining an interconnection model of an electric utility power circuit, the power circuit comprising power circuit components, determining a location of damage on the power circuit, determining a restoration sequence based on the damage location and the interconnection model, and determining a predicted time to restore power to a particular customer of the electric utility based on the restoration sequence, the interconnection model, and the location of the damage.

A system for electric utility storm outage management includes a computing engine that is configured to perform: determining an interconnection model of an electric utility power circuit, the power circuit comprising power circuit components, determining a location of damage on the power circuit, determining a restoration sequence based on the damage location and the interconnection model, and determining a predicted time to restore power to a particular customer of the electric utility based on the restoration sequence, the interconnection model, and the location of the damage.

A method for electric utility storm outage management includes determining an interconnection model of an electric utility power circuit, the power circuit comprising power circuit components, determining assessed damages to the electric utility power circuit, and determining a predicted maintenance parameter based on the interconnection model and the assessed damages.

Other features are described below.

BRIEF DESCRIPTION OF THE DRAWINGS

Systems and methods for electric utility storm outage management are further described with reference to the accompanying drawings in which.

DETAILED DESCRIPTION OF ILLUSTRATIVE EMBODIMENTS

The electric utility storm outage management systems and methods are directed to the management of resources during a storm outage of a power circuit (e.g., an electric utility transmission and distribution system). The systems and methods use information prior to the occurrence of a storm to predict damage-related information that can be used to efficiently manage the electric utility resources. The systems and methods may be used by an electric utility to predict damages to the power circuit, maintenance crew person-days to repair the damages, consumer outages from the damage, an estimated time to restore the power circuit, predicted estimated time to restore power to a particular customer, an estimated cost to restore the power circuit, and the like. The systems and methods may also be used to track actual damages to the power circuit, actual maintenance crew person-days to repair the damages, actual consumer outages from the damage, actual time to restore the power circuit, actual time to restore power to a particular customer, actual cost to restore the power circuit, and the like. Further, the systems and methods may be modified based on historical predicted and actual information. The systems and methods may also track power circuit observations and power circuit restorations. The systems and methods may assist an electric utility to improve the management of its resources during storm outages. Such improved management may assist the utility to restore power more efficiently and quicker. The systems and methods may be implemented in one or more of the exemplary computing environments described in more detail below, or in other computing environments.

Figure 1:
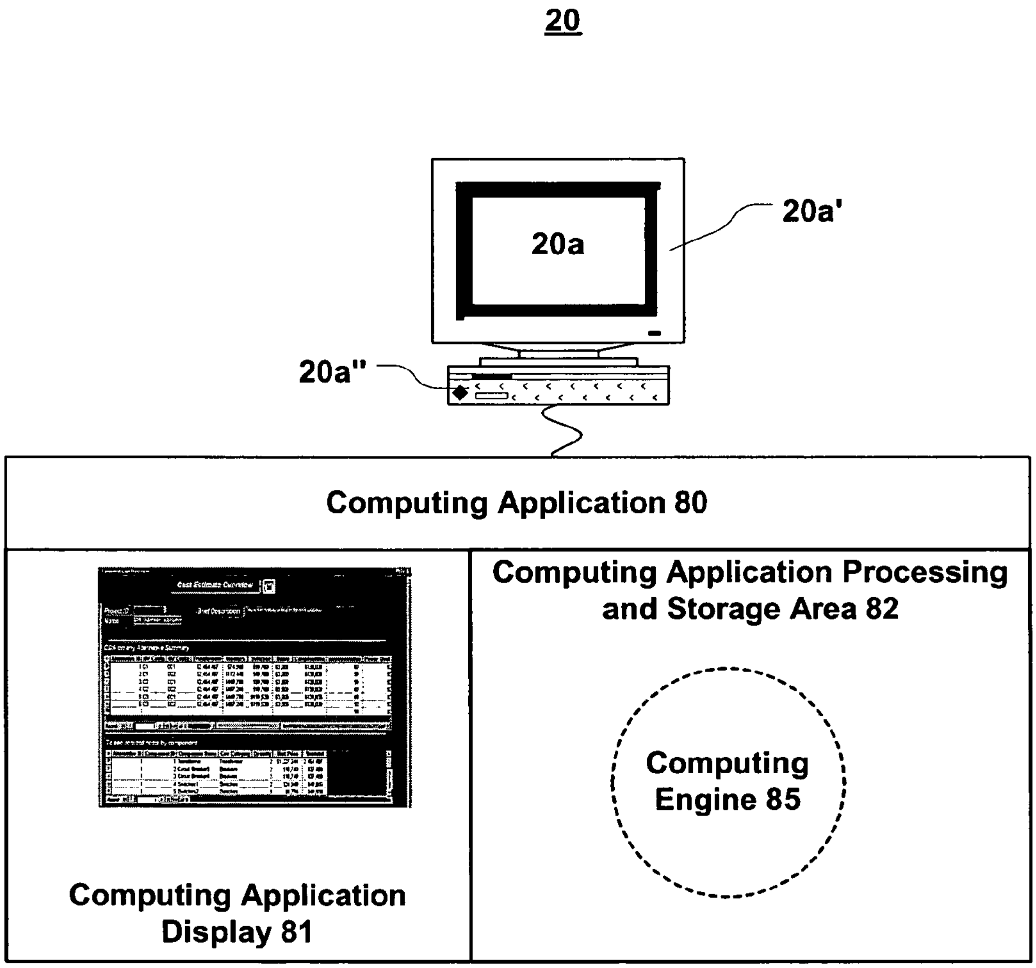
FIG. 1 is a diagram of an exemplary computing environment and an illustrative system for electric utility storm outage management, in accordance with an embodiment of the invention.

FIG. 1 shows computing system 20 that includes computer 20*a*. Computer 20*a* includes display device 20*a*' and interface and processing unit 20*a*'. Computer 20*a* executes computing application 80. As shown, computing application 80 includes a computing application processing and storage area 82 and a computing application display 81. Computing application processing and storage area 82 includes computing engine 85. Computing engine 85 may implement systems and methods for electric utility storm outage management. Computing application display 81 may include display content which may be used for electric utility storm outage management. In operation, a user (not shown) may interface with computing application 80 through computer 20*a*. The user may navigate through computing application 80 to input, display, and generate data and information for electric utility storm outage management.

Computing application 80 may generate predicted maintenance parameters, such as, for example, predicted damages to a power circuit, predicted maintenance crew person-days to repair the damages, predicted consumer outages from the damage, predicted estimated time to restore the power circuit, predicted estimated time to restore power to a particular customer, predicted estimated cost to restore the power circuit, and the like. Computing application 80 may also track actual maintenance parameters, such as, for example, actual damages to the power circuit, actual maintenance crew person-days to repair the damages, actual consumer outages from the damage, actual time to restore the power circuit, actual time to restore power to a particular customer, actual cost to restore the power circuit, and the like. The predicted information and actual information may be displayed to the user as display content via computing application display 81.

Figure 2:
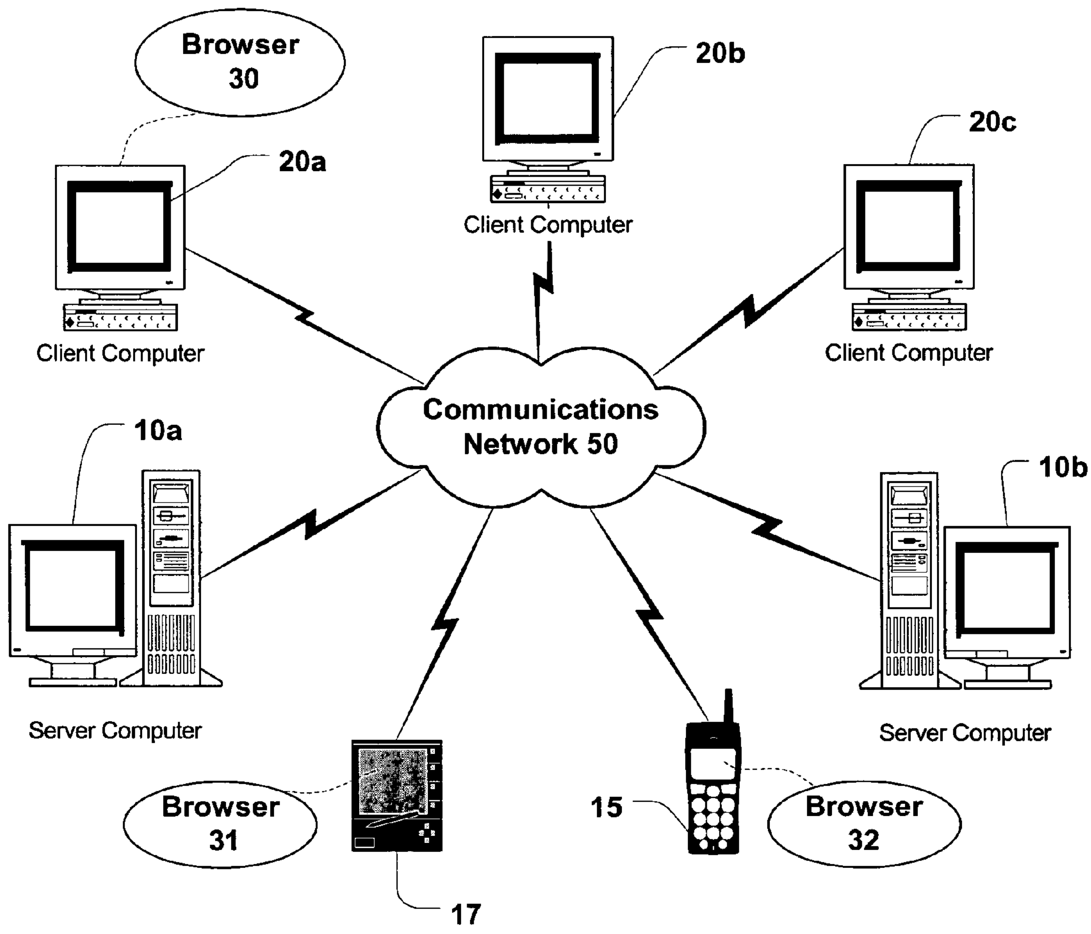
FIG. 2 is a diagram of an exemplary computing network environment and an illustrative system for electric utility storm outage management, in accordance with an embodiment of the invention.

Computer 20*a*, described above, can be deployed as part of a computer network. In general, the above description for computers may apply to both server computers and client computers deployed in a network environment. FIG. 2 illustrates an exemplary network environment having server computers in communication with client computers, in which systems and methods for electric utility storm outage management may be implemented. As shown in FIG. 2, a number of server computers 10*a*, 10*b*, etc., are interconnected via a communications network 50 with a number of client computers 20*a*, 20*b*, 20*c*, etc., or other computing devices, such as, a mobile phone 15, and a personal digital assistant 17. Communication network 50 may be a wireless network, a fixed-wire network, a local area network (LAN), a wide area network (WAN), an intranet, an extranet, the Internet, or the like. In a network environment in which the communications network 50 is the Internet, for example, server computers 10 can be Web servers with which client computers 20 communicate via any of a number of known communication protocols, such as, hypertext transfer protocol (HTTP), wireless application protocol (WAP), and the like. Each client computer 20 can be equipped with a browser 30 to communicate with server computers 10. Similarly, personal digital assistant 17 can be equipped with a browser 31 and mobile phone 15 can be equipped with a browser 32 to display and communicate various data.

In operation, the user may interact with computing application 80 to generate and display predicted and actual information, as described above. The predicted and actual information may be stored on server computers 10, client computers 20, or other client computing devices. The predicted and actual information may be communicated to users via client computing devices or client computers 20.

Thus, the systems and methods for electric utility storm outage management can be implemented and used in a computer network environment having client computing devices for accessing and interacting with the network and a server computer for interacting with client computers. The systems and methods can be implemented with a variety of network-based architectures, and thus should not be limited to the examples shown.

Figure 3:
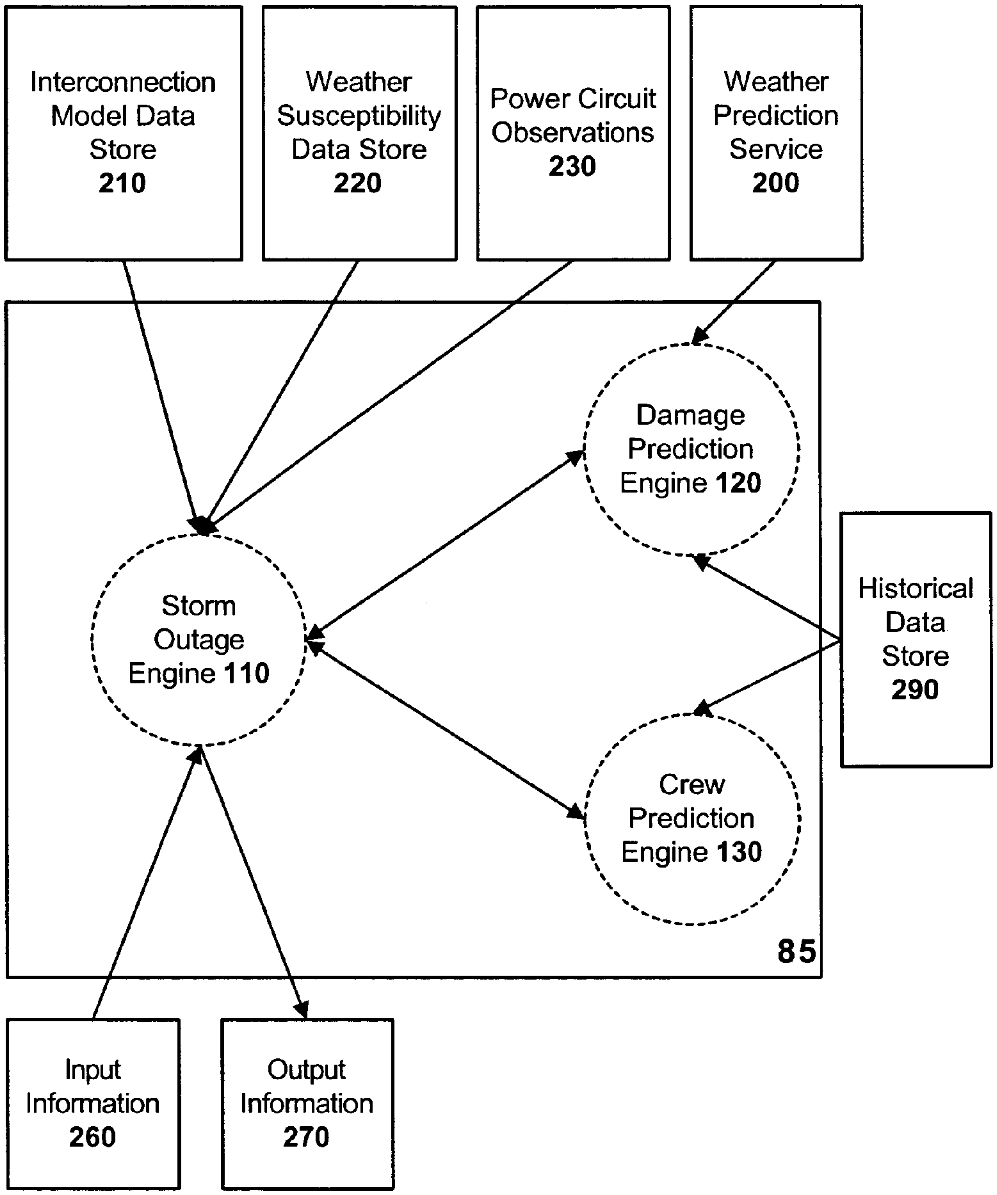
FIG. 3 is a diagram of an illustrative system for electric utility storm outage management, illustrating further details of the system of FIG. 1, in accordance with an embodiment of the invention.

FIG. 3 shows an illustrative embodiment of computing engine 85. As shown in FIG. 3, computing engine 85 includes storm outage engine 110, damage prediction engine 120, and maintenance crew prediction engine 130. While computing engine 85 is shown as being implemented in three separate engines, computing engine 85 may be implemented as one engine or any number of engines. Further, the various functionalities of the engines 110, 120, and 130 may be distributed among various engines in any convenient fashion.

Damage prediction engine 120 receives a weather prediction from a weather prediction service 200. The weather prediction may include predicted wind speed and duration, a predicted storm duration, a predicted snowfall amount, a predicted icing amount, and a predicted rainfall amount, a predicted storm type (e.g., hurricane, wind, ice, tornado, lighting, etc.), a predicted lightning location and intensity, and the like. The weather prediction may be embodied in or may accompany a Geographic Information System (GIS) file, or the like. Weather prediction service 200 may include a national weather service bureau, a commercial weather service organization, an automated weather prediction service, or the like.

Damage prediction engine 120 determines a predicted amount of damage to the power circuit based on the weather prediction from weather prediction service 200. Damage prediction engine 120 may determine a predicted per-unit amount of damage. For example, a predicted number of broken power poles per mile, a predicted number of downed power lines per mile, and a predicted number of damaged power transformers per mile, and the like. If damage prediction engine 120 determines a per-unit predicted amount of damage, then another engine (e.g., storm outage engine 110) may use that per-unit predicted amount of data and determines a predicted total amount of damage for the power circuit based on the power circuit interconnection model. The other engine (e.g., storm outage engine 110) may also determine the predicted total amount of damage based on weather-susceptibility information, and the like. Alternatively, damage prediction engine 120 may determine a total predicted amount of damage to the power circuit based on the weather prediction and the model of the interconnections of the power circuit, and the weather-susceptibility information of the power circuit components. The predicted amount of damage may be stored to historical data store 290. Historical data store 290 may also contain any of the data and information processed by computing engine 85, such as, for example, historical predicted maintenance parameters, historical weather predictions, historical power circuit observations, historical weather susceptibility information, historical interconnection models, historical user input and output information, historical predicted and actual crew costs, historical restoration times, and the like.

In one embodiment, damage prediction engine 120 receives the weather prediction from weather prediction service 200, which may be in the format of GIS files. Damage prediction engine 120 may convert the weather prediction to an indication of predicted intensity, such as, for example, a number using a simple scaling system. For example, the intensity of the storm may be rated on a scale from 1 to 3, from 1 to 10, and the like. Alternatively, various aspects of the weather, such as, for example, predicted wind speed, predicted rainfall amount, and the like may be rated on such a scale. Alternatively, more complex systems may be used to convert the weather prediction to an indication of predicted intensity. For example, conversions between wind speed and predicted intensity may be done on a smaller geographic basis (e.g., an intensity indication per feeder rather than an intensity indication per power circuit). Conversions may be linear, exponential, logarithmic, and the like. Additionally, a user may input, and damage prediction engine 120 may receive a predicted intensity. In this manner, a user may perform "what-if" analyses for various types of storms. For example, a user may enter a predicted storm intensity of '3' into a system and computing application 85 may determine predicted damages and predicted maintenance parameters (e.g., predicted number of customers, predicted time to restore each customer, etc.) based on the user-entered storm intensity.

The interconnection model of the power circuit may be stored in interconnection model data store 210. Interconnection model data store 210 may reside on computer 20*a*, for example, or on another computing device accessible to computing engine 85. For example, interconnection model data store 210 may reside on server 10*a* and typically may reside on another server if the interconnection model is an existing interconnection model. The interconnection model may include information about the components of the power circuit, such as, for example, the location of power lines, the location of power poles, the location of power transformers and sectionalizing switches and protective devices, the type of sectionalizing switches, the location of power consumers, the interconnectivity of the power circuit components, the connectivity of the power circuit to consumers, the layout of the power circuit, and the like.

Figure 7:
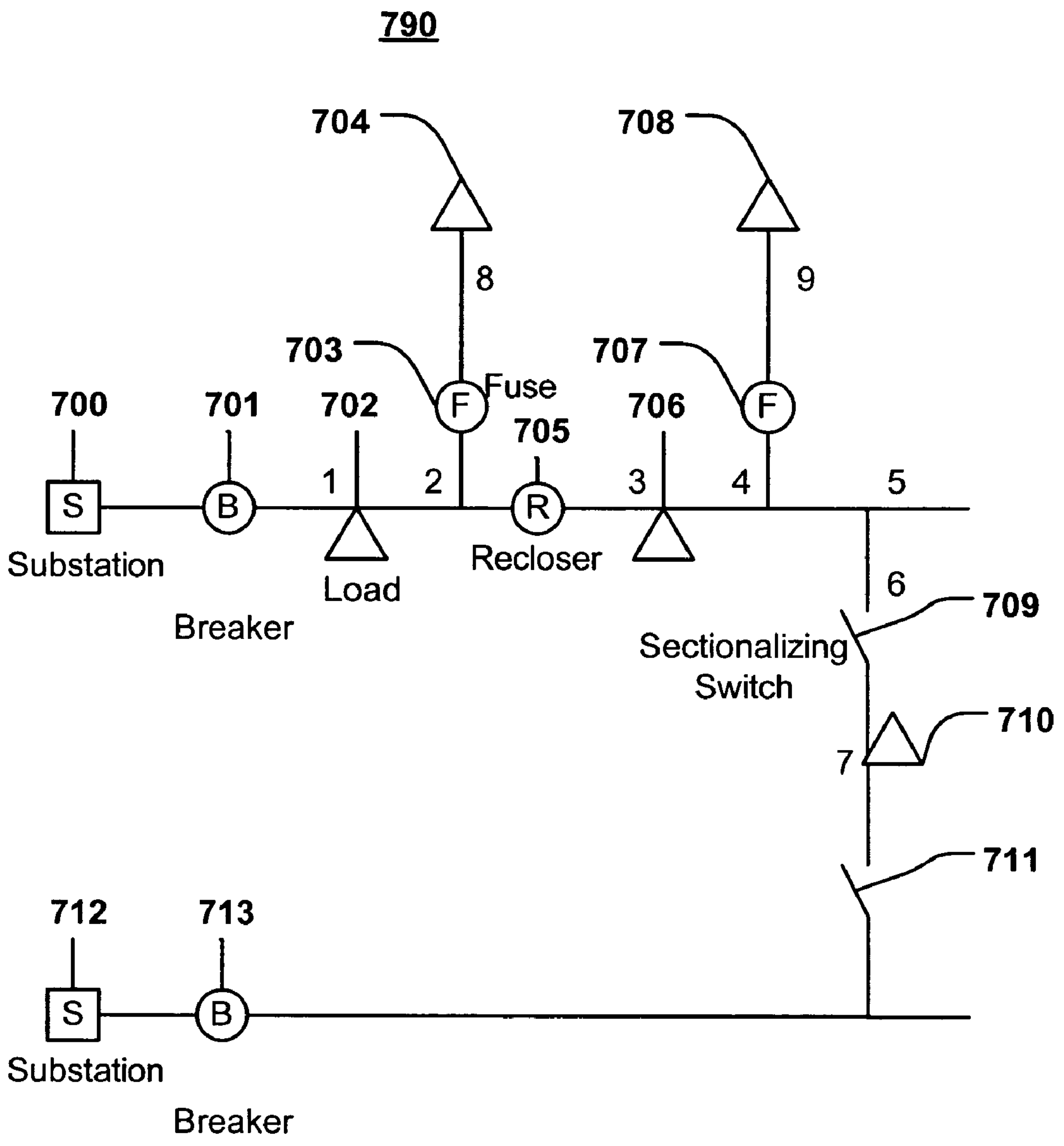
FIG. 7 is a circuit diagram of an exemplary power circuit with which the invention may be employed.

In one embodiment, the interconnectivity of the power circuit components may be modeled by a file using node numbers. An illustrative interconnectivity file is given below which models the power circuit of FIG. 7. (FIG. 7 shows an exemplary power circuit 790 having power circuit elements 700–713 interconnected via nodes 1–9.)

Interconnectivity File

%source type id, component id, phasing, equipment id,
SOURCE,sub,7,substation
%line type id, component id, upstream component id, phasing, equipment id, length (feet), protective device
LINE,one,sub,7,primary_1,10000,breaker
LINE,two,one,7,primary_1,10000
LINE,three,two,7,primary_1,10000,recloser
LINE,four,three,7,primary_1,10000
LINE,five,four,7,primary_1,2500
LINE,six,five,7,primary_1,5000
LINE,seven,six,7,primary_1,5000,sectionalizing_switch
LINE,eight,two,7,lateral_1,10000,fuse
LINE,nine,four,7,lateral_1,0000,fuse
LINE,ten,nine,7,lateral_1,10000

As shown, the interconnectivity file includes a file line that represents a source. The source line contains four fields: a first field representing that the component is a source type (e.g., 'SOURCE'), a second field representing the node associated with the source (e.g., 'sub'), a third field representing the phasing of the source (e.g., '7' for three phase), and a fourth field representing the type of the source or equipment identification (e.g., 'substation' for a substation). The power-line file line contains seven fields: a first field representing that the component is a line type (e.g., 'LINE'), a second field representing the node number at a first end of the power-line (e.g., 'one' for node 1), a third field representing the node number at the other end of the power-line (e.g., 'sub' for node substation), a fourth field representing the phasing of the source (e.g., '7' for three phase), a fifth field representing the type of the source or equipment identification (e.g., 'primary_1' for a primary power-line), a sixth field representing the length of the power-line (e.g., '10000' for 10,000 feet), and a seventh field representing the type of protection device for the power-line (e.g., 'breaker' for a breaker). While the interconnectivity file shown includes a particular arrangement of data, other files arrangements may be used and other ways of modeling the power circuit may be used, such as, for example, computer-aided design (CAD) models and the like.

The interconnectivity file may also include information about the number of customers at each load or a separate file may include such information, as shown below.

Customer Location File

%component id, kVA, Customers, transformer type
one,2000,100,xfmr_1
three,100,300,xfmr_1
seven,400,400,xfmr_1
eight,400,500,xfmr_1
nine,400,200,xfmr_1
ten,400,100,xfmr_1

As shown, the customer location file includes a line for each load (which may include multiple customers). The line contains four fields: a first field representing the node number of the load (e.g., 'one' for node 1), a second field representing the power rating of the transformer feeding the load (e.g., '2000' for a 2000 kVA transformer), a third field representing the number of customers fed by that transformer, and a fourth field representing the transformer type (e.g., 'xfmr_1' for a particular transformer type). While the file shown includes a particular arrangement of data, other files arrangements may be used and other ways of modeling the power circuit may be used, such as, for example, CAD models and the like.

Weather susceptibility information may be stored in weather susceptibility information data store 220. Weather susceptibility information data store 220 may reside on computer 20*a*, for example, or on another computing device accessible to computing engine 85. For example, weather susceptibility information data store 220 may reside on server 10*a* or any client or server computer. Weather susceptibility information includes information about the weather susceptibility of components of the power circuit, such as, for example, power line pole age, power line component ice susceptibility, power line component wind susceptibility, tree density by location, and the like.

The indication of predicted intensity may be used to determine a corresponding weather susceptibility, thereby providing different equipment weather susceptibilities for different intensity storms, such as shown in the illustrative equipment weather susceptibility file below.

Equipment Weather Susceptibility File

%FEEDER id, ampacity, number of storm damage points, downline spans per mile, trees in line per mile
primary_1,400,3,2,5,5,10,10,20
primary_2,400,3,2,5,5,10,10,20
lateral_1,200,3,2,5,5,10,10,20
lateral_2,200,3,2,5,5,10,10,20
%TRANSFORMER id, Ampacity, number of storm damage points, probability of failure
xfmr_1,200,3,0.1,0.3,0.5
%SWITCH id, Ampacity
sectionalizing_switch,300
tie_switch,300
fuse,500
recloser,200
breaker,600
%SOURCE id, MVA Capacity, line kV rating
substation,15,12.47

As shown, the equipment weather susceptibility file includes file lines that represent various types of devices or components of the power circuit. For a feeder, the line contains multiple fields: a first field representing the device or component identification (e.g., 'primary_1' for a component type that is a type of primary feeder), a second field representing the ampacity of the feeder (e.g., '400' for an ampacity of 400), a third field representing the number of storm damage points or the number of ranges in a weather intensity scale (e.g., '3' for a weather intensity scale that is divided into three ranges, such as, low intensity, medium intensity, and high intensity), and a pair of fields for each range in the weather intensity scale, the first field of the pair representing a predicted number of power-line spans down per mile, the second field of the pair representing a predicted number of trees down per mile (e.g., for a storm predicted to have low intensity a prediction of '2' spans down per mile and a prediction of '5' trees down per mile). For a transformer, the line contains multiple fields: a first field representing the feeder identification (e.g., 'xfmr_1' for a particular type of transformer), a second field representing the ampacity of the transformer (e.g., '200' for an ampacity of 200), a third field representing the number of storm damage points or the number of ranges in a weather intensity scale (e.g., '3' for a weather intensity scale that is divided into three ranges, such as, low intensity, medium intensity, and high intensity), and a fourth field representing a probability of transformer failure (e.g., '0.1' for a 0.1 percent chance of transformer failure). Sectionalizing switch and substation information may also be contained in the equipment weather susceptibility file, such as, probability of failure and the like. The information may also include ampacity information for use in determining whether customers can be fed from an alternative feeder and the like. While the equipment weather susceptibility file shown includes a particular arrangement of data, other files arrangements may be used and other ways of modeling the susceptibility may be used.

Damage prediction engine 120 may interface with storm outage engine 110 as shown to communicate with interconnection model data store 210 and weather susceptibility information data store 220. Also, damage prediction engine 120 may communicate directly (or via network 50) with interconnection model data store 210 and weather susceptibility information data store 220.

Maintenance crew prediction engine 130 receives the damage prediction (or an indication of the types of damages predicted) that was determined by damage prediction engine 120 (or storm outage engine 110) and determines a predicted maintenance crew requirement. The predicted maintenance crew requirement may be a predicted per-damage type maintenance crew requirement, may be a predicted total maintenance crew requirement for all the predicted damage, or the like. For example, maintenance crew prediction engine 130 may determine a predicted crew type and a predicted crew person-day requirement to repair each type of damage predicted (e.g., a prediction that it takes a line crew one day to repair twelve spans of downed line). Also, maintenance crew prediction engine 130 may determine a predicted crew type and a predicted crew person-day requirement to repair all of the predicted damage (e.g., a prediction that ten line crews and two tree crews will be required to handle the storm outage maintenance). If maintenance crew prediction engine 130 determines predicted per-damage type maintenance crew requirements, another engine (e.g., storm outage engine 110) converts the per-damage type maintenance crew requirements to total maintenance requirements based on the predicted damage to the power circuit. The predicted maintenance crew requirement may be stored to historical data store 290.

Maintenance crew prediction engine may include or access a maintenance crew productivity file as shown below.

```
Crew Productivity File
%Crew repair work capability
%Crew type id, trees/day, spans/day, transformers/day, cost/day
tree_crew,25,0,0,2000
two_man_crew,5,0,4,3000
four_man_crew,7,10,6,5000
```

As shown, the maintenance crew productivity file includes a file line for each type of crew. The line contains five fields: a first field representing the type of crew (e.g., 'tree_crew' for a tree maintenance crew), a second field representing the number of trees per day the crew can maintain (e.g., '25' trees per day), a third field representing the number of spans per day the crew can repair (e.g., '10' spans per day), a fourth field representing the number of transformers per day the crew can repair (e.g., '4' transformers per day), and a fifth field representing the cost per day of the crew (e.g., '2000' for $2000 per day). While the file shown includes a particular arrangement of data, other files arrangements may be used and other ways of modeling the maintenance crew productivity may be used.

Storm outage engine 110 determines a predicted maintenance parameter, such as, for example, a predicted amount of damage to the power circuit, a predicted maintenance crew person-days to repair the damages, a predicted consumer outages from the damage, a predicted estimated time to restore the power circuit, a predicted estimated cost to restore the power circuit, and the like based on the predicted maintenance crew requirement and the predicted amount and location of damage to the power circuit. In this manner, maintenance crews may be sent to a staging location near the location of predicted damage. The predicted maintenance parameters may also be stored to historical data store 290.

Storm outage engine 110 may determine the maintenance parameter predictions on a per feeder basis and then sum the predicted damage for each feeder. Predicted time to restore the power circuit may be based on assumptions (or rules) that the primary feeder will be repaired first, that feeder reconfiguration will or will not be employed, that medium size feeders will be repaired next, and that feeders to a small number of homes will be repaired last, which loads have priority (e.g., hospitals), or other rules. These rules and assumptions may be applied to the interconnection model and the predicted damage, actual damage, or some combination thereof, to determine a restoration sequence. In this manner, storm outage engine 110 may determine an estimated time to restore power to each power consumer. Storm outage engine 110 may also update the estimate time to restore power to each power consumer based on power circuit observations, such as, for example, observations of actual damage, observations of repairs, and the like.

Storm outage engine 110 may also use other information to determine the predicted maintenance parameter. For example, storm outage engine 110 may use maintenance crew availability, maintenance crew cost, maintenance crew scheduling constraints, and the like to determine the predicted maintenance parameter. Maintenance crew cost and scheduling constraints may be located in crew prediction engine 130, historical data store 290, a business management system database such as an SAP database, or any other database, data table, or the like. Maintenance crew cost information may include both internal and external (contractor) crew information. Information (e.g., maintenance crew availability, maintenance crew cost, maintenance crew scheduling constraints) may also be received as input information 260, which may be stored on computer 20*a*, may be received as user input into computer 20*a*, may be received via network 50, or the like. In this manner, a user may input various crew costs and various crew numbers to perform "what-if" analysis on various crew deployments. The user may also input a number of outage days desired and storm outage engine 110 may output a predicted number of crews and a predicted cost to meet the desired number of outage days.

Alternate inputs to storm outage engine 110 may be in form of predicted line crew days and tree crew days (instead of predicted number of spans down and trees down), and the like, for use by storm outage engine 110 in predicting maintenance parameters.

Storm outage engine 110 may also track actual maintenance parameters, such as, for example, actual damages to the power circuit, actual maintenance crew person-days to repair the damages, actual consumer outages from the damage, actual time to restore the power circuit, actual time to restore power to a particular customer, actual cost to restore the power circuit, and the like. The actual damages to the power circuit, actual maintenance crew person-days to repair the damages, actual consumer outages from the damage, actual time to restore the power circuit, actual time to restore power to a particular customer, actual cost to restore the power circuit information, and the like may also be stored to historical data store 290.

Once the storm hits, storm outage engine 110 may use additional data to make a revised prediction regarding the maintenance parameters. For example, storm outage engine 110 may receive power circuit observations 230, such as, customer call information, update information from maintenance crews, information from data acquisition systems, information about power circuit recloser trips, information from damage assessment crews, and the like. Storm outage engine 110 may use the power circuit observations 230 to make a revised prediction upon receipt of the power circuit observations 230, upon some periodic interval, some combination thereof, or the like. For example, if the damage assessments average 10 trees down per mile of power-line and the weather susceptibility indicated a predicted average of 5 trees down per mile, storm outage engine may calculate revised predicted total number of trees down using 10 trees down per mile of power-line. Storm outage engine 110 may also use, for example, power circuit observations to determine an accumulated cost of the storm outage to date. Also, storm outage engine 110 may use actual power circuit observations of actual damage to determine an estimated time to restore power to a particular customer. Storm outage engine 110 may also determine other predicted maintenance parameters based on user input and power circuit observations of actual damage.

The predicted maintenance parameters may be output as output information 270 and displayed on computing application display 81. For example, the predicted amount of damage to the power circuit may be displayed in graphical form, such as a graphical representation of the power circuit having a particular indication associated with portions of the power circuit being predicted to be damaged. For example, all portions of the power circuit downstream from a transformer that is predicted to be damaged may be highlighted in yellow, marked with and "x," or the like.

Figure 8:
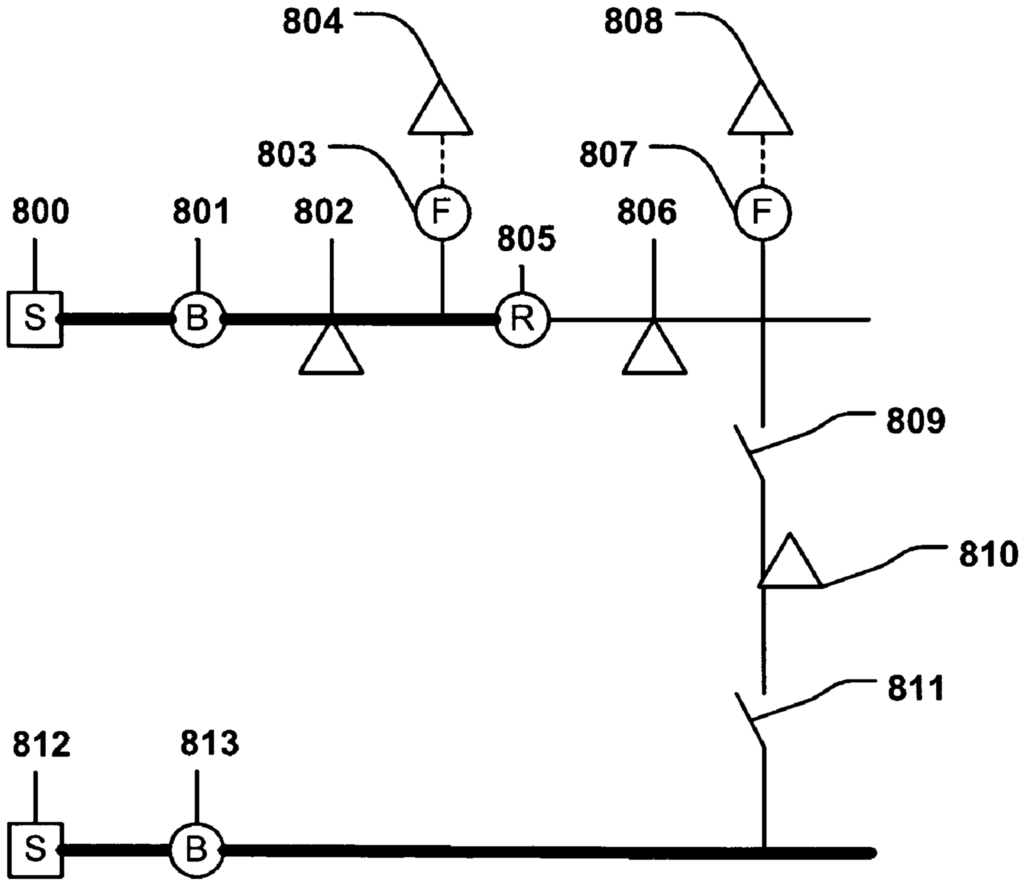
FIG. 8 is an illustrative display for electric utility storm outage management, in accordance with an embodiment of the invention.

Typically, the display is arranged to correspond the physical geometry of the power circuit. FIG. 7 shows an illustrative power circuit 790. Power circuit 790 includes power circuit elements such as substations 700 and 712, breakers 701 and 713, loads 702, 704, 708, and 710, fuses 703 and 707, recloser 705, and sectionalizing switches 709 and 711 interconnected as shown. FIG. 8 shows an illustrative display 890 representing power circuit 790. As shown, FIG. 8 includes display elements 800–813 that correspond to power circuit elements 700–713. Display 890 may represent the predicted outage configuration of the power circuit. For example, the power-line to loads 704 and 708 may be illustrated with a hash marked line (or color or the like) to indicate a prediction that those loads are likely to lose power. The power-line to between recloser 705 and substation 800 may be illustrated with a bold line (or color or the like) to indicate a prediction that those loads are not likely to lose power.

Storm outage engine 110 may also output a report of the predicted maintenance parameters. For example, a report may include the following information:

CUSTOMER OUTAGE STATUS

Total Customers Out: 1600
Percent of Customers Out: 100

SYSTEM DAMAGE STATUS

| | | |
|---|---|---|
| Percent of System Assessed 0 | | |
| Damage Verified - | Spans Down: 0 | Trees Down: 0 |
| Damage Predicted - | Spans Down: 78 | Trees Down: 156 |
| Damage Repaired - | Spans Down: 0 | Trees Down: 0 |
| Expected Line Crew Days Remaining: 7.8 | | |
| Expected Tree Crew Days Remaining: 6.3 | | |

CREW STATUS

Number of Line Crews Assigned: 2
Number of Tree Crews Assigned: 2

MANPOWER COST STATUS

| | | |
|---|---|---|
| Cost of Assessed Damage Remaining - | Spans Down: $ 0 | Trees Down: $ 0 |
| Cost of Predicted Damage Remaining - | Spans Down: $ 39063 | Trees Down: $ 12500 |
| Cost of Damage Already Repaired - | Spans Down: $ 0 | Trees Down: $ 0 |
| Total Cost: $ 51563 | | |

-continued

| ETR STATUS | | |
|---|---|---|
| Total ETR in Days 3.91 | | |
| ETR (in Days) by Customer Transformer | | |
| Xfmr: one | No. Cust: 100 | ETR: 0.95 |
| Xfmr: three | No. Cust: 300 | ETR: 2.25 |
| Xfmr: seven | No. Cust: 400 | ETR: 2.96 |
| Xfmr: eight | No. Cust: 500 | ETR: 2.72 |
| Xfmr: nine | No. Cust: 200 | ETR: 3.91 |
| Xfmr: ten | No. Cust: 100 | ETR: 3.91 |

As can be seen, all of the damage in this report is predicted and none of the damage has been either verified or repaired. The estimated time to restore (ETR) the entire system is 3.91 days. Also, each load transformer has its own estimated time to restoration determined and displayed. For example, the estimated time to restore the load (100 customers) of transformer one is 0.95 days while the estimated time to restore the load (another 100 customers) of transformer ten is 3.91 days.

In addition to determining predicted maintenance parameters, storm outage engine 110 may track actual maintenance parameters. For example, actual damage may be tracked in a damage assessment report file, as shown below.

Damage Assessment Report File

%line type id, component id, upstream component id, number spans down, number trees down LINE,one,sub,9,17

LINE,ten,nine,12,20

As shown, the damage assessment report file includes a file line for each damage assessment. The file line contains five fields: a first field representing the component type (e.g., 'LINE' for power-line), a second field representing the node at the load side of the component (e.g., 'one' for node one), a third field representing the node at the source side of the component (e.g., 'sub' for node sub), a fourth field representing the number of spans down on the line (e.g., '9' spans down), and a fifth field representing the number of trees down on the line (e.g., '17' trees down). While the file shown includes a particular arrangement of data, other files arrangements may be used and other ways of modeling the damage assessments may be used. Storm outage engine 110 may generate reports for such damage assessments.

Actual restoration of power to customers may be tracked by storm outage engine 110 and included in a repair restoration progress report file, as shown below.

Repair Restoration Progress Report File

%line type id, component id, upstream component id, number spans fixed, number trees fixed, service reenergized LINE,one,sub,9,17,0

LINE,two,one,8,16,0

LINE,one,sub,0,0,1

As shown, the repair restoration progress report file includes a line for each power-line component repaired. The line contains six fields: a first field representing the component type (e.g., 'LINE' for power-line), a second field representing the component (e.g., '1' for line number 1), a third field representing the upstream power circuit component (e.g., 'sub' for a substation), a fourth field representing the number of spans repaired on the line (e.g., '9' spans repaired), a fifth field representing the number of trees maintained on the line (e.g., '17' trees maintained), and a sixth field represent whether the switch or breaker associated with that component has been closed (e.g., '0' for switch open and '1' for switch closed). While the file shown includes a particular arrangement of data, other files arrangements may be used and other ways of modeling the repair restoration progress may be used.

Using these files, storm outage engine 110 may recalculate predicted maintenance parameters based on actual maintenance parameters determined, as described in more detail above. Storm outage engine 110 can then generate additional reports based on the actual maintenance parameters and the recalculated predicted maintenance parameters. An illustrative additional report is shown below.

| CUSTOMER OUTAGE STATUS | | |
|---|---|---|
| Total Customers Out: 1600 | | |
| Percent of Customers Out: 100 | | |
| SYSTEM DAMAGE STATUS | | |
| Percent of System Assessed 24 | | |
| Damage Verified - | Spans Down: 21 | Trees Down: 37 |
| Damage Predicted - | Spans Down: 62 | Trees Down: 112 |
| Damage Repaired - | Spans Down: 0 | Trees Down: 0 |
| Expected Line Crew Days Remaining: 8.3 | | |
| Expected Tree Crew Days Remaining: 6.0 | | |
| CREW STATUS | | |
| Number of Line Crews Assigned: 2 | | |
| Number of Tree Crews Assigned: 2 | | |

-continued

| | | |
|---|---|---|
| MANPOWER COST STATUS | | |
| Cost of Assessed Damage Remaining - | Spans Down: $ 10500 | Trees Down: $ 2960 |
| Cost of Predicted Damage Remaining - | Spans Down: $ 31125 | Trees Down: $ 8980 |
| Cost of Damage Already Repaired - | Spans Down: $ 0 | Trees Down: $ 0 |
| Total Cost: $ 53565 | | |
| ETR STATUS | | |
| Total ETR in Days 4.16 | | |
| ETR (in Days) by Customer Transformer | | |
| Xfmr: one | No. Cust: 100 | ETR: 0.90 |
| Xfmr: three | No. Cust: 300 | ETR: 2.14 |
| Xfmr: seven | No. Cust: 400 | ETR: 2.96 |
| Xfmr: eight | No. Cust: 500 | ETR: 2.74 |
| Xfmr: nine | No. Cust: 200 | ETR: 4.16 |
| Xfmr: ten | No. Cust: 100 | ETR: 4.16 |

Figure 9:
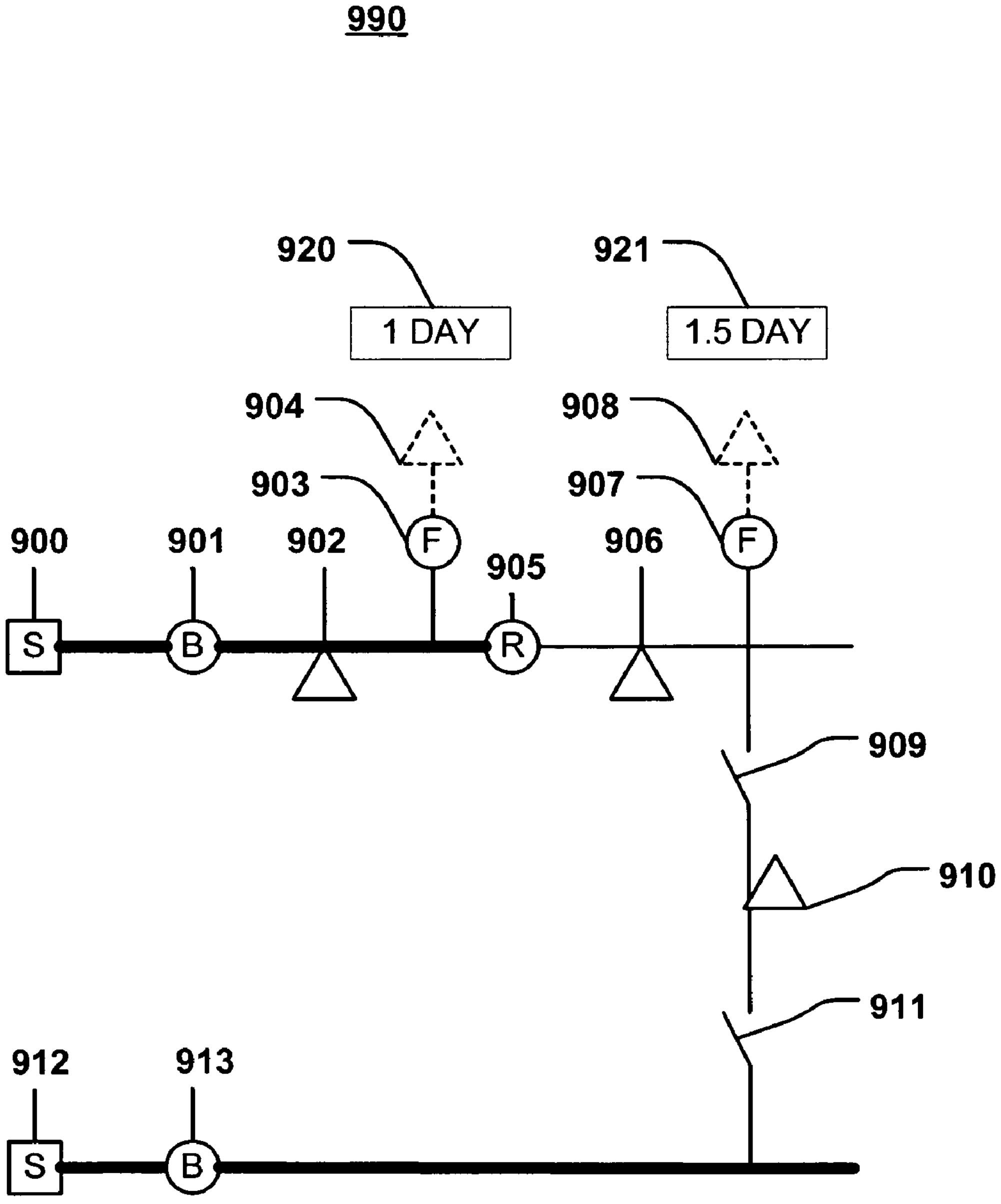
FIG. 9 is another illustrative display for electric utility storm outage management, in accordance with an embodiment of the invention.

As can be seen in this illustrative report, 24% of the system has been assessed, therefore, some of the damage is verified and some of the damage remains predicted. The verified damage may be illustrated on a display such as shown in FIG. 9. FIG. 9 shows an illustrative display 990 representing power circuit 790. As shown, FIG. 9 includes display elements 900–913 that correspond to power circuit elements 900–913. Display 990 may represent the predicted outage configuration of the power circuit. For example, loads 704 and 708 may be illustrated with a hash marked line (or color or the like) to indicate that they have been assessed and power loss has been verified. Computing application display 81 may be revised based on the actual maintenance parameters received by storm outage engine 110. For example, once a customer call is received corresponding to a portion of the power circuit that is predicted to be damaged, the graphical representation of that portion of the power circuit may be displayed having a different indication. For example, portions of the power circuit which have confirmed damage may be highlighted in red, marked with and "-----" pattern, or the like. Also, once confirmation is received that a portion of the circuit has been restored to normal operation, that portion may be displayed normally, or with another different indication. For example, a restored portion of the power circuit may be highlighted in blue, marked with a double-line, or the like.

Storm outage engine 110 may also determine predicted maintenance parameters based on the actual maintenance parameters and maintenance restoration information. Storm outage engine 110 can then generate additional reports based on the actual maintenance parameters and maintenance restoration information. An illustrative additional report is shown below.

| | | |
|---|---|---|
| CUSTOMER OUTAGE STATUS | | |
| Total Customers Out: 1500 | | |
| Percent of Customers Out: 94 | | |
| SYSTEM DAMAGE STATUS | | |
| Percent of System Assessed 100 | | |
| Damage Verified - | Spans Down: 69 | Trees Down: 125 |
| Damage Predicted - | Spans Down: 0 | Trees Down: 0 |
| Damage Repaired - | Spans Down: 17 | Trees Down: 33 |
| Expected Line Crew Days Remaining: 6.9 | | |
| Expected Tree Crew Days Remaining: 5.0 | | |
| CREW STATUS | | |
| Number of Line Crews Assigned: 2 | | |
| Number of Tree Crews Assigned: 2 | | |
| MANPOWER COST STATUS | | |
| Cost of Assessed Damage Remaining - | Spans Down: $ 34500 | Trees Down: $ 10000 |
| Cost of Predicted Damage Remaining - | Spans Down: $ 0 | Trees Down: $ 0 |
| Cost of Damage Already Repaired - | Spans Down: $ 8500 | Trees Down: $ 2640 |
| Total Cost: $ 55640 | | |
| ETR STATUS | | |
| Total ETR in Days 3.45 | | |
| ETR (in Days) by Customer Transformer | | |
| Xfmr: one | No. Cust: 100 | ETR: 0.00 |
| Xfmr: three | No. Cust: 300 | ETR: 1.50 |
| Xfmr: seven | No. Cust: 400 | ETR: 2.30 |
| Xfmr: eight | No. Cust: 500 | ETR: 2.10 |
| Xfmr: nine | No. Cust: 200 | ETR: 3.45 |
| Xfmr: ten | No. Cust: 100 | ETR: 3.45 |

As can be seen, 100% of the system has been assessed and 94% the damage remains to be restored. Note that an ETR of zero may refer to a customer whose power has been restored.

Storm outage engine 110 may continue to update the predicted maintenance parameters based on the actual maintenance parameters and maintenance restoration information. Storm outage engine 110 can then generate additional reports, as shown below.

CUSTOMER OUTAGE STATUS

Total Customers Out: 1200
Percent of Customers Out: 75

SYSTEM DAMAGE STATUS

Percent of System Assessed 100

| | | |
|---|---|---|
| Damage Verified - | Spans Down: 39 | Trees Down: 67 |
| Damage Predicted - | Spans Down: 0 | Trees Down: 0 |
| Damage Repaired - | Spans Down: 47 | Trees Down: 91 |

Expected Line Crew Days Remaining: 3.9
Expected Tree Crew Days Remaining: 2.7

CREW STATUS

Number of Line Crews Assigned: 2
Number of Tree Crews Assigned: 2

MANPOWER COST STATUS

| | | |
|---|---|---|
| Cost of Assessed Damage Remaining - | Spans Down: $ 19500 | Trees Down: $ 5360 |
| Cost of Predicted Damage Remaining - | Spans Down: $ 0 | Trees Down: $ 0 |
| Cost of Damage Already Repaired - | Spans Down: $ 23500 | Trees Down: $ 7280 |

Total Cost: $ 55640

ETR STATUS

Total ETR in Days 1.95
ETR (in Days) by Customer Transformer

| | | |
|---|---|---|
| Xfmr: one | No. Cust: 100 | ETR: 0.00 |
| Xfmr: three | No. Cust: 300 | ETR: 0.00 |
| Xfmr: seven | No. Cust: 400 | ETR: 0.80 |
| Xfmr: eight | No. Cust: 500 | ETR: 0.60 |
| Xfmr: nine | No. Cust: 200 | ETR: 1.95 |
| Xfmr: ten | No. Cust: 100 | ETR: 1.95 |

As can be seen, 100% of the system has been assessed and 75% the damage remains to be restored. Storm outage engine 110 may also receive user input representing adjustments to the number of crews and output predicted maintenance parameters based on the adjusted number of crews. Storm outage engine 110 may determine adjusted predicted maintenance parameters based on the user input.

Storm outage engine 110 may continue to update the predicted maintenance parameters based on the actual maintenance parameters and maintenance restoration information until all customers have their power restored. Storm outage engine 110 can continue to receive power circuit observations, including power circuit restoration information, and then generate another report, as shown below.

CUSTOMER OUTAGE STATUS

Total Customers Out: 0
Percent of Customers Out: 0

SYSTEM DAMAGE STATUS

Percent of System Assessed 100

| | | |
|---|---|---|
| Damage Verified - | Spans Down: 0 | Trees Down: 0 |
| Damage Predicted - | Spans Down: 0 | Trees Down: 0 |
| Damage Repaired - | Spans Down: 86 | Trees Down: 158 |

Expected Line Crew Days Remaining: 0.0
Expected Tree Crew Days Remaining: 0.0

CREW STATUS

Number of Line Crews Assigned: 2
Number of Tree Crews Assigned: 2

MANPOWER COST STATUS

| | | |
|---|---|---|
| Cost of Assessed Damage Remaining - | Spans Down: $ 0 | Trees Down: $ 0 |
| Cost of Predicted Damage Remaining - | Spans Down: $ 0 | Trees Down: $ 0 |
| Cost of Damage Already Repaired - | Spans Down: $ 43000 | Trees Down: $ 12640 |

Total Cost: $ 55640

-continued

ETR STATUS

Total ETR in Days 0.00
ETR (in Days) by Customer Transformer

| | | |
|---|---|---|
| Xfmr: one | No. Cust: 100 | ETR: 0.00 |
| Xfmr: three | No. Cust: 300 | ETR: 0.00 |
| Xfmr: seven | No. Cust: 400 | ETR: 0.00 |
| Xfmr: eight | No. Cust: 500 | ETR: 0.00 |
| Xfmr: nine | No. Cust: 200 | ETR: 0.00 |
| Xfmr: ten | No. Cust: 100 | ETR: 0.00 |

As can be seen, 100% of the system has been assessed and 100% the damage has been repaired and restored. Storm outage engine 110 may output actual maintenance parameters, such as, for example, a total cost, and the like.

Further, storm outage engine 110 (or damage prediction engine 120 or maintenance crew prediction engine 130) may use the predicted and actual information in historical data store 290 to revise the rules of computing engine 85, refine weather susceptibility information, refine multipliers used to determine predicted maintenance parameters, and the like. Such revision may be done automatically, may be done at periodic intervals, may request user authorization to effect each revision, and the like.

Figure 4:
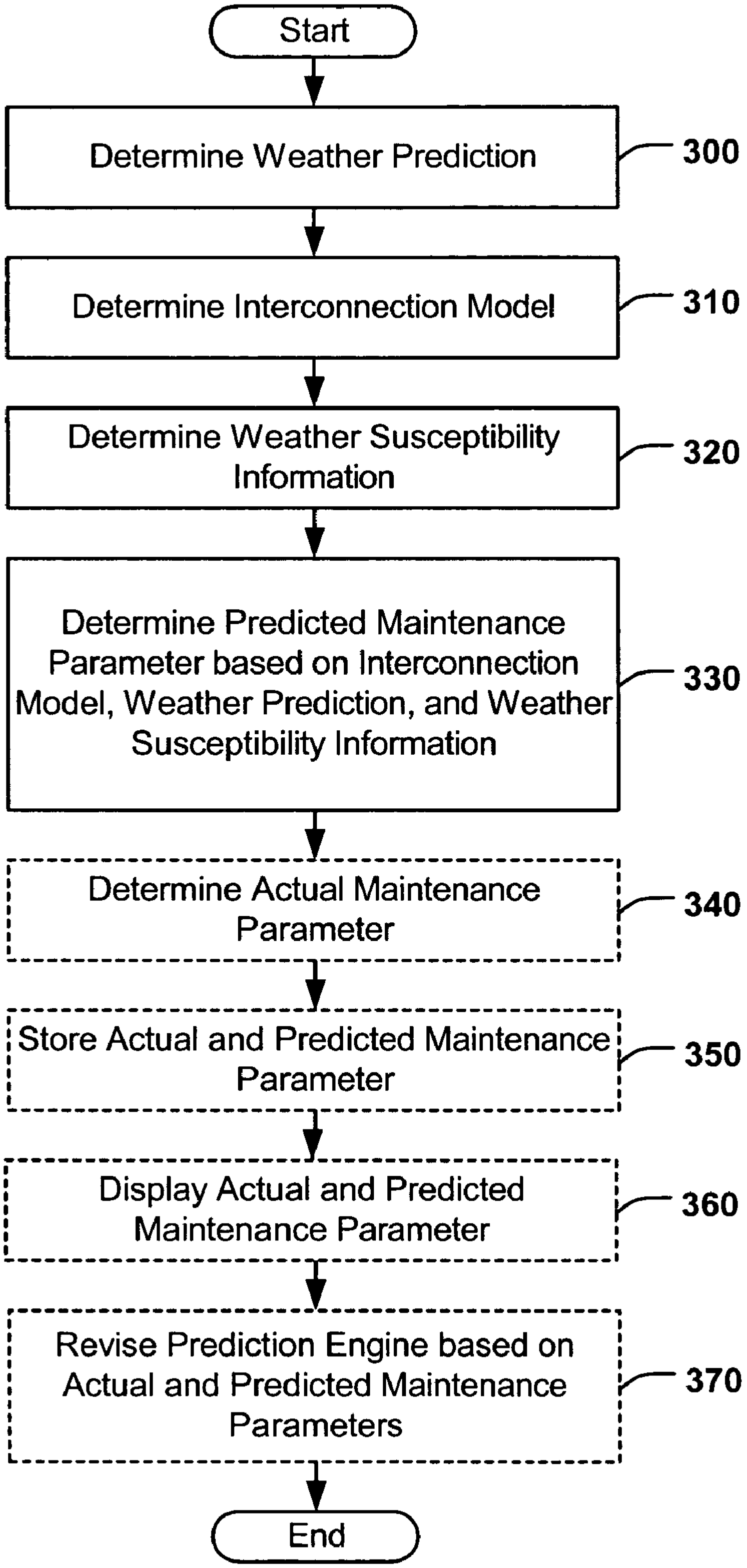
FIG. 4 is a flow diagram of an illustrative method for electric utility storm outage management, in accordance with an embodiment of the invention.
Figure 5:
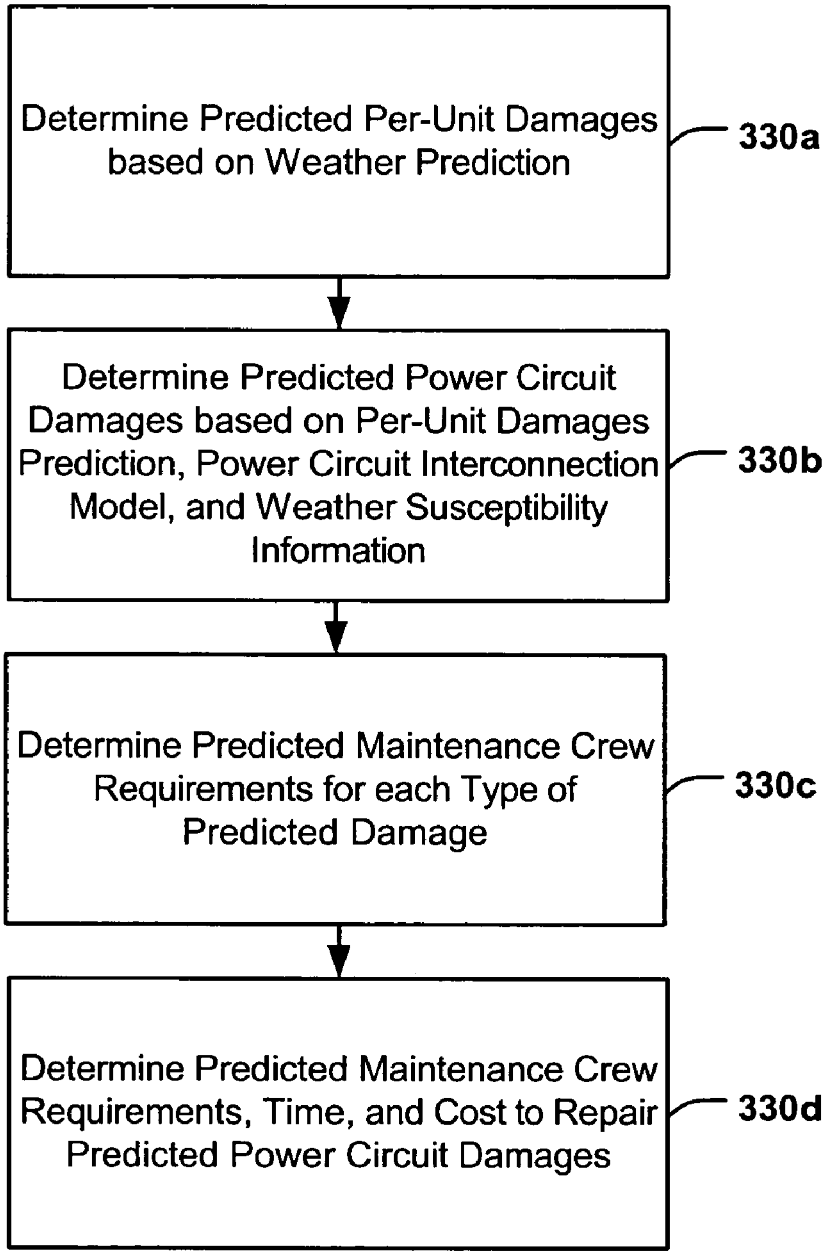
FIG. 5 is a flow diagram illustrating further detail of the flow diagram of FIG. 4, in accordance with an embodiment of the invention.

FIGS. 4 and 5 show flow charts of an illustrative method for electric utility storm outage management. While the following description includes references to the system of FIG. 3, the method may be implemented in a variety of ways, such as, for example, by a single computing engine, by multiple computing engines, via a standalone computing system, via a networked computing system, and the like.

As shown in FIG. 4, at step 300, damage prediction engine 120 determines a weather prediction by receiving a weather prediction from a weather prediction service 200. The weather prediction may include predicted wind speed, a predicted storm duration, a predicted snowfall amount, a predicted icing amount, a predicted rainfall amount, a GIS file, and the like.

At step 310, storm outage engine 110 determines an interconnection model of the power circuit from interconnection model data store 210. The interconnection model may include information about the components of the power circuit, such as, for example, the location of power lines, the location of power poles, the location of power transformers and sectionalizing switches and protective devices, the type of sectionalizing switches, the location of power consumers, the interconnectivity of the power circuit components, the connectivity of the power circuit to consumers, the layout of the power circuit, and the like.

At step 320, storm outage engine 110 determines weather susceptibility information from weather susceptibility information data store 220. Weather susceptibility information may include information about the weather susceptibility of components of the power circuit, such as, for example, power line pole age, power line component ice susceptibility, power line component wind susceptibility, and the like.

At step 330*a*, damage prediction engine 120 determines a predicted per-unit amount of damage to the power circuit based on the weather prediction from weather prediction service 200. Damage prediction engine 120 may determine, for example, a predicted number of broken power poles per mile, a predicted number of downed power lines per mile, and a predicted number of damaged power transformers per mile, and the like. Alternatively, damage prediction engine 120 may determine the predicted total amount of damage to the power circuit based on the model of the interconnections of the power circuit, the weather prediction, weather-susceptibility information of the power circuit components, and the like (and possibly obviating step 330*b*).

At step 330*b*, storm outage engine 110 determines a total predicted amount of power circuit damage based on the predicted per-unit amount of damage from damage prediction engine 120, based on the interconnection model of the power circuit, and based on the weather susceptibility information of the power circuit components. The predicted total amount of damage may be location specific, may be a total number of components, or some combination thereof.

At step 330*c*, maintenance crew prediction engine 130 may receive the damage prediction or an indication of the types of damages predicted that was determined at steps 330*a* and 330*b* and determines a predicted maintenance crew requirement for each type of predicted damage. Alternatively, maintenance crew prediction engine 130 may determine a predicted total maintenance crew requirement for the storm outage based on the total predicted damages.

At step 330*d*, storm outage engine 110 determines a predicted maintenance parameter, such as, for example, a predicted amount of damage to the power circuit, a predicted maintenance crew person-days to repair the damages, a predicted consumer outages from the damage, a predicted estimated time to restore the power circuit, a predicted estimated cost to restore the power circuit, and the like based on the predicted maintenance crew requirement and the predicted amount of damage to the power circuit. Storm outage engine 110 may determine such maintenance parameter predictions based also on maintenance crew availability, maintenance crew cost, maintenance crew scheduling constraints, and the like.

At step 340, storm outage engine 110 may also determine and track actual maintenance parameters, such as, for example, actual damages to the power circuit, actual maintenance crew person-days to repair the damages, actual consumer outages from the damage, actual time to restore the power circuit, actual cost to restore the power circuit, and the like. For example, storm outage engine 110 may receive power circuit observations 230, such as, customer call information, update information from maintenance crews, information from data acquisition systems, information about power circuit recloser trips, information from damage assessment crews, and the like.

At this point, steps 320 and 330 may be re-executed and the predicted maintenance parameter may be determined based also on the actual maintenance parameter determined at step 340. Also, step 320 may use revised weather susceptibility information based on actual damage assessments, and the like. For example, if an original weather susceptibility data point predicted five downed trees per mile, but damage assessment data showed an actual average of ten downed trees per mile, storm outage engine 110 or damage prediction engine 120 may use the actual average value of ten trees per mile in determining a predicted amount of power circuit damage in the areas of the power circuit which have not yet had an assessment completed.

At step 350, storm outage engine 110 may store the predicted and actual damages of the power circuit, the predicted and actual maintenance crew person-days to repair the damages, the predicted and actual consumer outages from the damage, the predicted and actual time to restore the power circuit, the predicted and actual cost to restore the power circuit information, and the like to historical data store 290.

At step 360, storm outage engine 110 may display the predicted maintenance parameters on computing application display 81. For example, the predicted amount of damage to the power circuit may be displayed in graphical form, such as a graphical representation of the power circuit having a particular indication associated with portions of the power circuit being predicted to be damaged. Storm outage engine 110 may also display the actual maintenance parameters determined at step 340. For example, once a customer call is received corresponding to a portion of the power circuit that is predicted to be damaged, the graphical representation of that portion of the power circuit may be displayed having a different indication. Also, once confirmation is received that a portion of the circuit has been restored to normal operation, that portion may be displayed normally, or with another different indication. Further, storm outage engine 110 may continually display the predicted maintenance parameters on computing application display 81 and continually update the display based on new information being received by storm outage engine 110.

At step 370, storm outage engine 110, damage prediction engine 120, maintenance crew prediction engine 130, or weather susceptibility data store 220 may be revised based on the actual data received at step 340. For example, storm outage engine 110 may use the predicted and actual information in historical data store 290 to revise the engine rules, refine weather susceptibility information, refine multipliers used to determine predicted maintenance parameters, and the like. Step 370 may be performed automatically, may be done at periodic intervals, may request user authorization to effect each revision, and the like. Various steps of the methods may be repeated once additional information, for example, power circuit observations, and the like, become available to storm outage engine 110.

Figure 6:
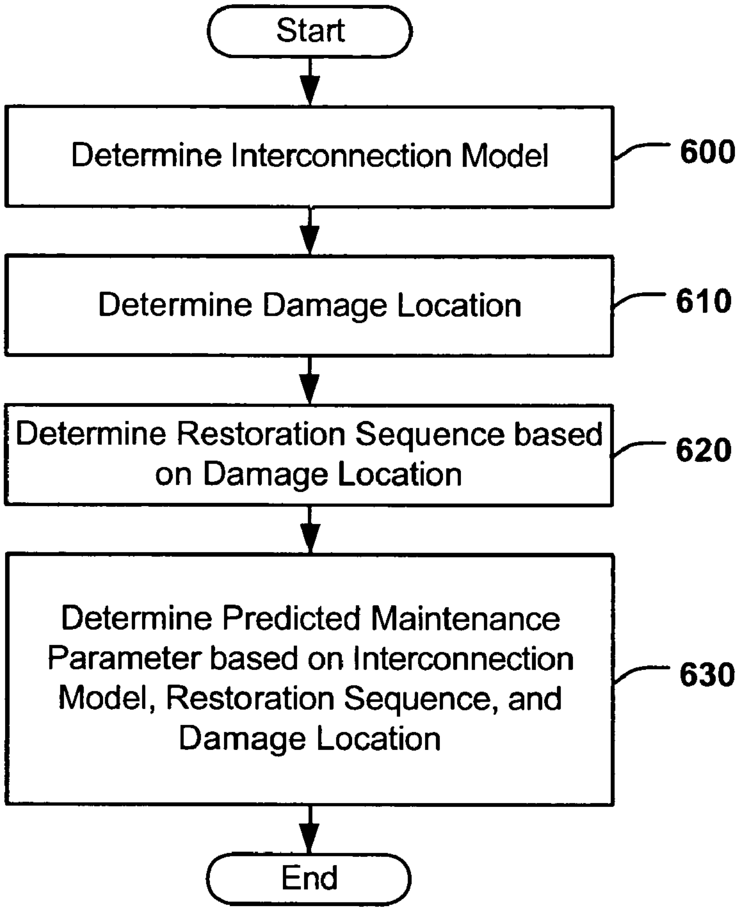
FIG. 6 is a flow diagram of another illustrative method for electric utility storm outage management, in accordance with an embodiment of the invention.

FIG. 6 shows a flow chart of an illustrative method for electric utility storm outage management. While the following description includes references to the system of FIG. 3, the method may be implemented in a variety of ways, such as, for example, by a single computing engine, by multiple computing engines, via a standalone computing system, via a networked computing system, and the like.

At step 600, storm outage engine 110 determines an interconnection model of the power circuit from interconnection model data store 210. The interconnection model may include information about the components of the power circuit, such as, for example, the location of power lines, the location of power poles, the location of power transformers and sectionalizing switches and protective devices, the type of sectionalizing switches, the location of power consumers, the interconnectivity of the power circuit components, the connectivity of the power circuit to consumers, the layout of the power circuit, and the like.

At step 610, storm outage engine 110 determines a damage location, which may predicted and actual damage. Storm outage engine 110 may determine a damage location based on power circuit observations 230, such as, customer call information, update information from maintenance crews, information from data acquisition systems, information about power circuit recloser trips, information from damage assessment crews, and the like.

At step 620, storm outage engine 110 determines a restoration sequence for the power circuit. The restoration sequence may be based on the damage location, which may include predicted and actual damage. The restoration sequence may also be based on the interconnection model. The restoration sequence may be determined using rules, assumptions, prioritizations, or the like. The restoration sequence may be determined to optimize for lowest cost, for shortest time to restoration, for some combination thereof, and the like. For example, storm outage engine 110 may determine a restoration sequence that prioritizes loads having higher numbers of customers first. In this manner, a greater number of customers may be restored to power is less time. Also, some critical loads may be prioritized higher than residential loads. For example, hospitals nursing homes may be given high priority in the restoration sequence.

At step 630, storm outage engine 110 determines a predicted maintenance parameter, such as, for example, a time to restore power to a particular customer, based on the interconnection model, the restoration sequence, and the damage location. Time to restore power to a particular customer may also be determined based on predicted maintenance crew person-days to repair damages, and the like. Various steps of the methods may be repeated once additional information, for example, power circuit observations, power circuit restoration information, and the like, become available to storm outage engine 110.

Storm outage engine 110 may also display the predicted maintenance parameter, such as, for example, a predicted time to restore power to a particular customer determined at step 630. FIG. 9 shows such an illustrative display 990. As shown in FIG. 9, display elements 900–913 correspond to power circuit elements 700–713, respectively. Display element 904 corresponds to load 704 and is displayed with a hashed line to indicate that load 704 is experiencing a power outage. Alternatively, display element 904 may be displayed with a particular color to indicate that load 704 is experiencing a power outage. Display element 920 indicates the estimated time to restore load 704 determined at step 630. As shown, display element 920 indicates that the estimated time to restore load 704 is 1 day. Display element 921 indicates the estimated time to restore load 708 determined at step 630. As shown, display element 921 indicates that the estimated time to restore load 708 is 1.5 days. In this manner, an electric utility may communicate a predicted time to restore power to particular customer to that customer. Alternatively, the electric utility may decide to add some predefined time to the estimate, add some predefined percentage to the estimate, use the highest estimate of the entire feeder associated with a particular customer, and the like.

Figure 10:
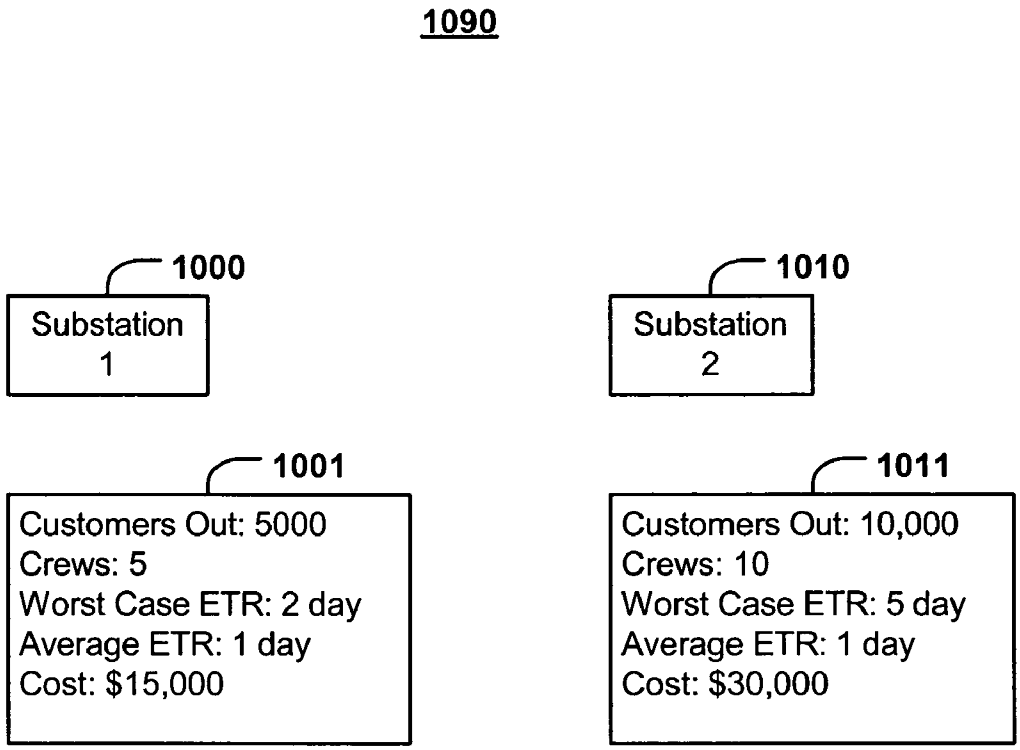
FIG. 10 is still another illustrative display for electric utility storm outage management, in accordance with an embodiment of the invention.

FIG. 10 shows another illustrative display 1090. As shown in FIG. 10, display element 1000 represents substation 1 and display element 1010 represents substation 2. Display elements 1000, 1010 may be arranged on display 1090 in a particular geometry to represent the geometry of the power circuit. Display element 1001 is located proximate display element 1000 and indicates storm outage maintenance parameters associated with substation 1. Display element 1011 is located proximate display element 1010 and indicates storm outage maintenance parameters associated with substation 2. As shown, display element 1001 indicates that 5000 customers are experiencing a power outage, 5 maintenance crews are currently assigned to substation 1, the worst case predicted time to power restoration (ETR) is 2 days, the average ETR is 1 day, and the predicted cost to repair is $15,000. Display element 1011 indicates that 10,000 customers are experiencing a power outage, 10 maintenance crews are currently assigned to substation 2, the worst case predicted time to power restoration (ETR) is 5 days, the average ETR is 1 day, and the predicted cost to repair is $30,000. In this manner, an electric utility can quickly review the deployment of maintenance crews to determine if the deployment corresponds with the number of customers experiencing outages and the like.

As can be seen, the above described systems and methods provide a technique for efficient management of maintenance resources before and during an electric utility storm outage. As such, an electric utility may more efficiently prepare for and implement storm outage maintenance.

Program code (i.e., instructions) for performing the above-described methods may be stored on a computer-readable medium, such as a magnetic, electrical, or optical storage medium, including without limitation a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer, the machine becomes an apparatus for practicing the invention. The invention may also be embodied in the form of program code that is transmitted over some transmission medium, such as over electrical wiring or cabling, through fiber optics, over a network, including the Internet or an intranet, or via any other form of transmission, wherein, when the program code is received and loaded into and executed by a machine, such as a computer, the machine becomes an apparatus for practicing the above-described processes. When implemented on a general-purpose processor, the program code combines with the processor to provide an apparatus that operates analogously to specific logic circuits.

It is noted that the foregoing description has been provided merely for the purpose of explanation and is not to be construed as limiting of the invention. While the invention has been described with reference to illustrative embodiments, it is understood that the words which have been used herein are words of description and illustration, rather than words of limitation. Further, although the invention has been described herein with reference to particular structure, methods, and embodiments, the invention is not intended to be limited to the particulars disclosed herein; rather, the invention extends to all structures, methods and uses that are within the scope of the appended claims. Those skilled in the art, having the benefit of the teachings of this specification, may effect numerous modifications thereto and changes may be made without departing from the scope and spirit of the invention, as defined by the appended claims.

What is claimed:

1. A method for electric utility storm outage management, the method comprising:

providing an interconnection model for an electric utility power circuit that comprises power circuit components, the interconnection model including information about the layout of the power circuit and the interconnectivity of the power circuit components;

providing a store of weather susceptibility information for the power circuit components for different weather conditions, wherein the weather susceptibility information for the power circuit components is different for different weather conditions;

receiving a weather prediction; and determining a predicted maintenance parameter for the power circuit based on the interconnection model, the weather susceptibility information, and the weather prediction.

2. The method as recited in claim 1, further comprising receiving information about the actual condition of the power circuit, and wherein determining the predicted maintenance parameter comprises determining the predicted maintenance parameter based on the interconnection model, the weather susceptibility information, the weather prediction, and the information about the actual condition of the power circuit.

3. The method as recited in claim 2, wherein the information about the actual condition comprises at least one of a power consumer observation report, a data acquisition system report, and a maintenance crew report.

4. The method as recited in claim 1, wherein the weather susceptibility information comprises at least one of power line component age, power line pole age, power line component ice susceptibility, and power line component wind susceptibility.

5. The method as recited in claim 1, wherein the weather prediction comprises at least one of predicted wind speed, a predicted storm duration, a predicted snowfall amount, a predicted icing amount, and a predicted rainfall amount.

6. The method as recited in claim 1, wherein the predicted maintenance parameter comprises a predicted maintenance crew requirement.

7. The method as recited in claim 6, wherein determining the predicted maintenance crew requirement comprises determining a predicted maintenance crew person-day requirement based on a predicted damage type.

8. The method as recited in claim 1, wherein the predicted maintenance parameter comprises a prediction of a location of power consumers affected by the predicted power circuit damage.

9. The method as recited in claim 1, wherein the predicted maintenance parameter comprises a prediction of a time to repair the predicted power circuit damage.

10. The method as recited in claim 1, wherein the predicted maintenance parameter comprises a prediction of a cast to repair the power circuit damage.

11. The method as recited in claim 1, wherein determining the predicted maintenance parameter comprises determining a predicted amount of damage to the power circuit.

12. The method as recited in claim 11, wherein the predicted amount of damage comprises at least one of a predicted number of broken power poles, a predicted number of downed power lines, and a predicted number of damaged power transformers.

13. The method as recited in claim 1, further comprising determining an actual maintenance parameter corresponding to the predicted maintenance parameter; and using the predicted maintenance parameter and the actual maintenance parameter to modify parameters that were used to determine the predicted maintenance parameter.

14. A system for electric utility storm outage management, the system comprising:

a model data store containing an interconnection model for an electric utility power circuit that comprises power circuit components, the interconnection model including information about the layout of the power circuit and the interconnectivity of the power circuit components;

an information data store containing weather susceptibility information for the power circuit components for different weather conditions, wherein the weather susceptibility information for the power circuit components is different for different weather conditions;

a computing engine operable to receive a weather prediction and to access the model data store and the information data store, said computing engine being configured to determine a predicted maintenance parameter for the power circuit based on the interconnection model, the weather susceptibility information, and the weather prediction.

15. The system as recited in claim 14, wherein the computing engine comprises:

a damage prediction engine that is capable of:

receiving the weather prediction; and determining a per-unit damage prediction; and a storm outage engine that is capable:

accessing the interconnection model of the power circuit;

accessing the information indicative of weather susceptibility of the power circuit components; and determining a total damage prediction based on the interconnection model, the weather susceptibility information, and the per-unit damage prediction.

16. The system as recited in claim 15, wherein the computing engine further comprises a maintenance crew prediction engine that is capable of determining a predicted maintenance crew requirement for each type of damage predicted; and wherein the storm outage engine is further capable of determining a predicted total time to repair the damage based on the total damage prediction and the predicted maintenance crew requirement for each type of damage.

17. The system as recited in claim 14, wherein the computing engine is further capable of receiving information about the actual condition of the power circuit, and wherein determining the predicted maintenance parameter comprises determining the predicted maintenance parameter based on the interconnection model, the weather susceptibility information, the weather prediction, and the information about the actual condition of the power circuit.

18. The system as recited in claim 14, wherein the weather susceptibility information comprises at least one of power line component age, power line pole age, power line component ice susceptibility, and power line component wind susceptibility.

19. The system as recited in claim 14, wherein the weather prediction comprises at least one of predicted wind speed, a predicted storm duration, a predicted snowfall amount, a predicted icing amount, and a predicted rainfall amount.

20. The system as recited in claim 14, wherein the predicted maintenance parameter comprises a prediction of a location of power consumers affected by the predicted power circuit damage.

21. The system as recited in claim 14, wherein the predicted maintenance parameter comprises a prediction of a time to repair the predicted power circuit damage.

22. The system as recited in claim 14, wherein the predicted maintenance parameter comprises a prediction of a cost to repair the power circuit damage.

23. The system as recited in claim 14, wherein determining the predicted maintenance parameter comprises determining a predicted amount of damage to the power circuit.

24. The system as recited in claim 23, wherein the predicted amount of damage comprises at least one of a predicted number of broken power poles, a predicted number of downed power lines, and a predicted number of damaged power transformers.

25. The method of claim 1, wherein the weather susceptibility information includes failure probabilities for the power circuit components.

26. The system of claim 14, wherein the weather susceptibility information includes failure probabilities for the power circuit components.

* * * * *